United States Patent [19]

Akamatsu

[11] 4,164,667

[45] Aug. 14, 1979

[54] SEMICONDUCTOR SWITCH DEVICE

[75] Inventor: Masahiko Akamatsu, Amagasaki, Japan

[73] Assignee: Mitsubishi Denki Kabushiki Kaisha, Tokyo, Japan

[21] Appl. No.: 844,194

[22] Filed: Oct. 21, 1977

Related U.S. Application Data

[63] Continuation of Ser. No. 695,055, Jun. 11, 1976, abandoned.

[30] Foreign Application Priority Data

Jun. 23, 1975 [JP] Japan ................................ 50-78321
Aug. 28, 1975 [JP] Japan ............................... 50-104308

[51] Int. Cl.² ........................................... H03K 17/60
[52] U.S. Cl. .................................. 307/253; 307/254; 307/314
[58] Field of Search ............... 307/253, 254, 314, 275, 307/255; 331/113 A

[56] References Cited

U.S. PATENT DOCUMENTS

| | | | |
|---|---|---|---|
| 3,219,844 | 11/1965 | Martin | 307/254 |
| 3,273,050 | 9/1966 | Pratt | 307/314 X |
| 3,482,109 | 12/1969 | Yii | 307/314 X |
| 3,983,418 | 9/1976 | Wallace | 307/314 X |
| 3,986,052 | 10/1976 | Hunter | 307/314 X |

Primary Examiner—John Zazworsky
Attorney, Agent, or Firm—Oblon, Fisher, Spivak, McClelland & Maier

[57] ABSTRACT

A semiconductor switch device includes a semiconductor switch with a control electrode disposed serially in a power path connecting a DC power source and a load; a current transformer having a core and having a primary conductor for passing current in response to a turn-on of the semiconductor switch and a secondary winding connected to the control electrode of the semiconductor switch; and a magnetizing force applicator for magnetizing the core of the current transformer in the direction opposite to the magnetization generated by current flowing in the primary conductor.

9 Claims, 18 Drawing Figures

SEMICONDUCTOR SWITCH DEVICE

This is a continuation of application Ser. No. 695,055, filed June 11, 1976, and now abandoned.

BACKGROUND OF THE INVENTION

1. Field of the Invention

The present invention relates to semiconductor switches, and more particularly to improvements in power transistor switch devices and to methods for supplying current to the control electrode of such switch devices.

2. Description of the Prior Art

Prior art techniques have provided power transistor switch devices capable of self-replenishing the base drive power, i.e. a Royer oscillator. This type of switch device, however, can be used only as an AC power generator and is not satisfactorily operable over a wide range of turn-on time ratios.

SUMMARY OF THE INVENTION

It is an object of the present invention to provide a power transistor switch device versatile in application and operable with a high self-sufficiency.

It is another object of the invention to provide a method for self-replenishing the base drive power in a power transistor switch device over a wide range of turn-on time ratios.

The foregoing and other objects are attained in accordance with one aspect of the present invention through the provision of a semiconductor switch device comprising a semiconductor switch with a control electrode disposed serially in a power path connecting a DC power source and a load; a current transformer having a core and having a primary conductor for passing current in response to a turn-on of the semiconductor switch and a secondary winding connected to the control electrode of the semiconductor switch; and a magnetizing force applying means for magnetizing the core of the current transformer in the direction opposite to the magnetization generated by current flowing in the primary conductor.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings in which.

DETAILED DESCRIPTION OF THE PREFERRED EMBODIMENTS

Figure 1A:
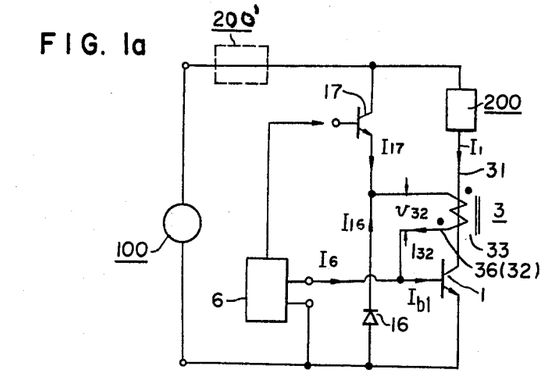
FIGS. 1(a) and 1(b) are circuit diagrams showing one embodiment of the present invention.

Referring now to the drawings, wherein like reference numerals designate identical or corresponding parts throughout the several views, and more particularly to FIG. 1(a) thereof, there is schematically shodevice of the invention, which comprises: a power transistor 1 inserted in a power path connecting a DC power source 100 and a load 200; a current transformer 3 having a primary conductor 31 capable of passing current $I_1$ in response to a turn-on of the transistor 1; a negative voltage blocking means 16 comprising a diode, which in combination with a secondary winding 32 and transistor 1 sets up a base current path; and a flux reset switch 17 for resetting the flux of a core 33, which comprises, for example, a transistor. The power source 100, the transistor 17, the secondary winding 32 and the transistor 1 form a magnetizing force applying means capable of generating a pulse voltage in the direction of demagnetizing the core 33 and thus resetting the flux thereof. The switch device further comprises a turn-on control means 6 for controlling turn-on of the power transistor 1 and the flux reset switch 17.

Figure 1B:
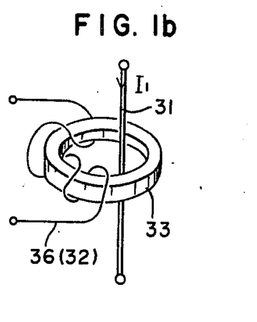

As shown in FIG. 1(b), the current transformer 3 has its core 33 equipped with one to several turns of primary conductor 31 and with a secondary winding 32. The core 33 may be made of a suitable material such as ferrite, permalloy or silicon steel according to the switching frequency used.

The operation of the switch device in FIGS. 1(a) and 1(b) will be described by referring to the waveform diagram of FIG. 2. During the turn-on period $t_{ON}$, the turn-on control current $I_6$ assumes a continuous positive waveform $+I_6'$ as indicated by the dotted line or a positive pulse waveform $+I_6$ as indicated by the solid line in the beginning of turn-on, as shown in FIG. 2(a), or instead, a pulse current may be provided in a cycle during the turn-on period $t_{ON}$. The flux reset switch (or briefly, reset switch) 17 allows a turn-on for a given period $t_R$ from the beginning of turn-on at a given time interval $T_R$ which includes periods such as a variable period and an adaptive control period depending on needs described below.

Figure 2:
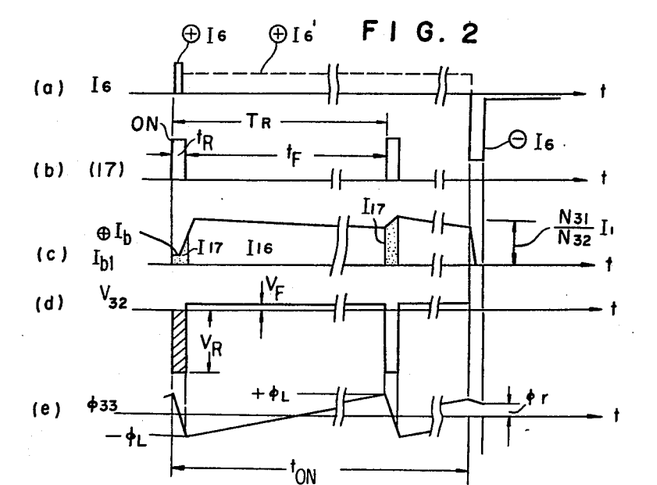
FIG. 2 is a waveform diagram useful for illustrating operations of the circuit shown in FIG. 1a, FIGS. 3 to 8 are circuit diagrams showing other embodiments of the invention.

In this state, the base current $I_{b1}$ of the power transistor 1 assumes a waveform as in FIG. 2(c). The secondary winding current $I_{17}$ is superposed on the current $+I_6$ through the transistor 17 and the secondary winding 32 causing the current $I_1$ of the main power transistor 1 to be increased. As a result, the secondary current $I_{17}$ ($=I_{32}$) increases. The current $I_6$ may fall to zero when the current $I_1$ reaches a given value.

For the period $t_R$, the reset switch 17 is on and the voltage $V_{32}$ of the secondary winding 32 which serves also as the reset winding 36 stands at a negative voltage $V_R$ as in FIG. 2(d) at the points indicated by dots (●) in FIG. 1(a). During this period, the core flux $\phi_{33}$ is rapidly reset down to $-\phi_L$ as in FIG. 2(e).

When the reset switch 17 turns off, the secondary winding current $I_{32}$ is shunted to the rectifier element 16 permitting the base current $I_{b1}$ of the power transistor to keep flowing as in FIG. 2(c). In this state, the secondary winding voltage $V_{32}$ stands at a positive voltage $V_F$ which is nearly equal to the sum of the voltage drop across the base-emitter of the transistor 1 and the voltage drop across the rectifier element 16. The period $t_F$ for which the base current $I_{b1}$ keeps flowing may be determined as follows according to the condition of balance between positive and negative flux variations.

$$t_F = \frac{V_R}{V_F} t_R \quad (1)$$

In practice, the voltage $V_R$ is of a value in the order of the main circuit voltage, and the voltage $V_F$ is of a very small value. Hence the period $t_F$ for which the base current keeps flowing is several tens to several hundred times the reset time $t_R$. In most applications, therefore, the period $t_F$ can meet the maximum turn-on period required of the circuit if only the reset switch 17 is turned on in the beginning of the turn-on operation making it possible to realize a maximum turn-on time or a substantially continuous turn-on period with a very short period of turn-off time included. During the period $t_F$, the core flux $\phi_{33}$ rises slowly to $+\phi_L$ as in FIG. 2(e). This flux can be returned to $-\phi_L$ by turning on the reset switch 17 for the period $t_R$. In this operation, the base current $I_{b1}$ is kept supplied. There is a proportional relation between the base current $I_{b1}$ and the main current $I_1$ as follows:

$$I_{b1} = \frac{N_{31} \cdot I_1}{N_{32}} + I_\epsilon \quad (2)$$

where
$N_{31}/N_{32}$: current ratio
$I_\epsilon$: exciting current seen by the secondary winding Thus, the power transistor is kept turned on for the necessary period of time without sacrificing current transformer function. At the same time, the base drive power can be replenished from the main circuit. This minimizes external power to drive the base thereof.

To turn off the transistor switch, a reverse bias current $-I_6$ in value exceeding the transformer secondary current $I_{32}$ is applied (or the current $I_{32}$ is shunted with respect to the base-emitter circuit, that is, the secondary winding 32 is shorted). This reverse bias current is equal to or less than the reverse bias pulse current applied for the purpose of releasing carriers stored in the power transistor 1 and thus prompts turn-off of the transistor 1. Hence, in most applications, the reverse bias current may be furnished without the need for an extra means.

The operation of the transistor switch for applications where the turn-on time is long has been described above. It is apparent that this transistor switch may readily be operated where the turn-on time is short. The minimum turn-off time of the transistor switch of the invention is similar to that of an ordinary power transistor. Accordingly, switching of the power transistor can be controlled in the desired turn-off time ratio.

The reset switch 17 may be a turn-off thyristor or a thyristor chopper. The reset switch and the reverse biasing means may be kept in operation during the turn-off period.

Figure 3:
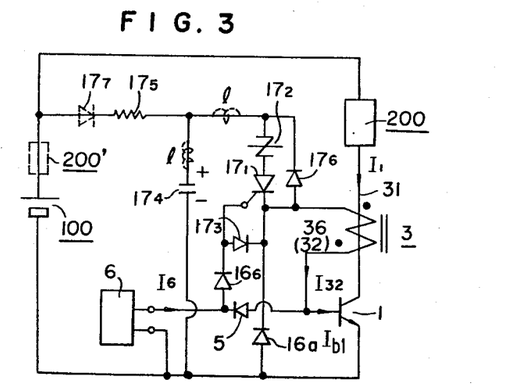

FIG. 3 schematically illustrates another embodiment of the invention wherein the reset switch in FIG. 1 is automatically controlled by the use of a turn-on control signal $I_6$. This transistor switch comprises a thyristor $17_1$, a breakover switch $17_2$, a rectifier element $17_6$, a reverse discharge preventing rectifier element $17_7$ used when a load 200' is connected, a capacitor $17_4$, a charging resistor or a charging reactor $17_5$, a wiring inductance or an inserted inductance 1, and a turn-on diode $17_3$. Before turn-on operation, the capacitor $17_4$ is charged at a polarity shown in FIG. 3. (If this capacitor is not charged, operation of the switch is not necessary since flux reset is effected immediately before the turn-on operation.)

With the turn-on signal $I_6$ applied, the thyristor $17_1$ is turned on by the rectifier element $16b$, turn-on diode $17_3$, thyristor $17_1$ secondary winding 32 and transistor 1. In this operation, the rectifier element $17_3$ serves as a shunt path for preventing excess gate current and thus produces a forward voltage drop which causes the thyristor $17_1$ to be turned on. The capacitor $17_4$ causes the breakover switch $17_2$ to be broken over and turned on whereby a negative voltage is applied to the secondary winding 32. The charge across the capacitor resets the core flux of the current transformer 3, provides the secondary current $I_{32}$ corresponding to the primary current $I_1$, and turns on the transistor 1. When the core flux reaches negative saturation, the capacitor starts releasing its charge oscillatively by the wiring inductance 1 and the secondary winding saturation inductance. When the capacitor potential falls to zero, the diode $16a$ turns on causing the operation period of the transformer 3 and the main transistor 1 to be shifted to the steady forward voltage period $t_F$.

The capacitor potential assumes a reverse polarity and then returns to the initial polarity shown in FIG. 3 through the rectifier elements $16a$ and $17_6$. The breakover switch $17_2$ turns off and the capacitor potential falls by an amount corresponding to the loss or energy transferred to the secondary winding. The capacitor is recharged slowly to the initial potential via the charging impedance $17_5$.

The thyristor $17_1$ is kept turned on by the current $I_6$. Accordingly, when the capacitor $17_4$ is recharged to the breakover voltage, it sets up a negative pulse voltage to effect flux reset.

In the foregoing manner, flux reset is automatically performed to maintain the power transistor 1 in conduction and the current transformer 3 in operation. In this embodiment, the use of the breakover switch $17_2$ can be obviated by utilizing the turn-on control means 6 to generate pulse current $I_6$ periodically.

Figure 4:
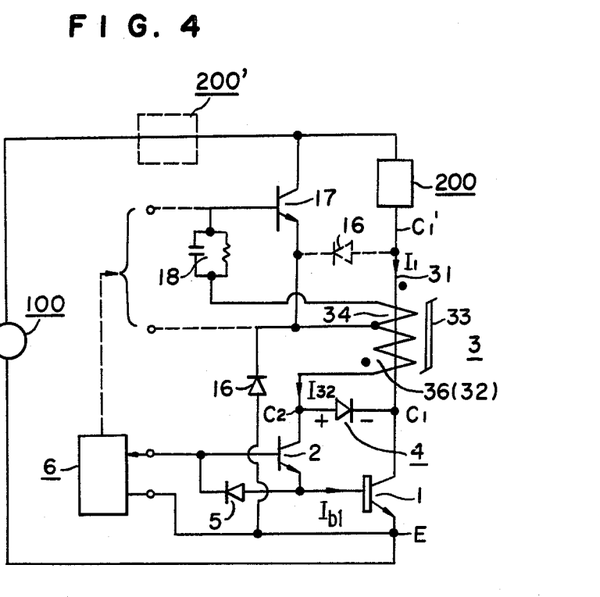

FIG. 4 schematically illustrates another embodiment of the invention wherein an auxiliary solid-state switch 2 is used in series with the secondary winding of the current transformer to serially cut off the base drive current $I_{32}$. This embodiment employs a means 4 for shunting the secondary current for the period during which the main transistor 1 turns off after the base current is cut off. Because the voltage drop across the auxiliary solid-state switch during the turn-on operation is low, the secondary current $I_{32}$ is applied to the auxiliary solid-state switch 2 and to the base of the power transistor during the turn-on operation by applying across terminals $C_1$ and $C_2$ a potential as low as the forward voltage drop across the rectifier element. For this reason, the shunt means 4 does not interfere with the circuit function during the turn-on operation.

The circuit shown in FIG. 4 comprises a winding 34 for detecting the level of magnetization of the core 33 and a coupling circuit 18 for causing the reset switch 17 to be turned on by a negative voltage. If it is assumed that the current in the primary winding 31 is the bias current, the secondary winding 32 is the drive winding, the detecting winding 34 is the positive feedback winding, and the reset switch 17 is the amplifying switch when the auxiliary solid-state switch 2 and the power transistor 1 are in the on state, then the switch 17, the secondary winding 32, the detecting winding 34 and the coupling circuit 18 form a monolithic magnetic multivibrator. In this circuit, the amplifying switch 17 turns on each time the core flux reaches the positive saturation level (the flux generated by the primary winding is assumed to be positive). As a result, the core flux returns to the negative saturation level, and the amplifying switch 17 turns off automatically due to the decrease in the detected voltage. The core flux rises during steady operation of the current transformer. As these operations are repeated, flux reset is automatically carried out at intervals of the desired period $T_R$ and for the given time $t_R$.

The switch 17 turns on or off when the core flux reaches the positive or negative saturation level. These saturation levels are detected by the detecting winding 34 in combination with the coupling circuit means 18 and the amplifier element 17.

To reset the core flux before it reaches the positive saturation level, it is necessary to periodically trigger the reset switch 17 as indicated by the dotted line in FIG. 4.

In FIG. 4, the rectifier element 16 for base current supply and for negative voltage blocking purposes may be connected to the terminal $C_1'$ or $C_1$ on the side of the collector of the main power transistor 1 as indicated by the dotted line.

Figure 5A:
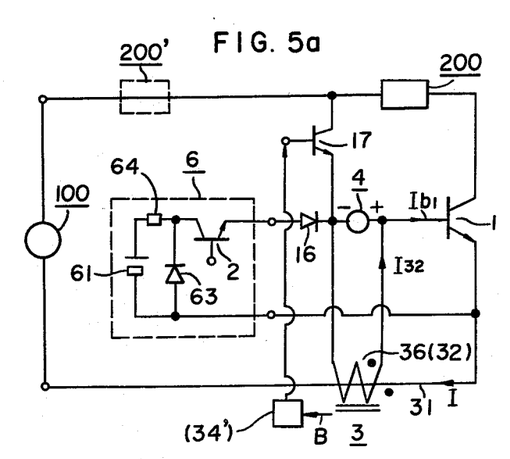

FIG. 5(a) is a circuit diagram of another embodiment of the invention wherein a closed loop is formed serially of the secondary winding 32 and the turn-on control means 6. The turn-on control means 6 comprises an auxiliary solid-state switch 2, a bypass diode 63, an initial base current supplying source 61 and a resistor 64.

Figure 5B:
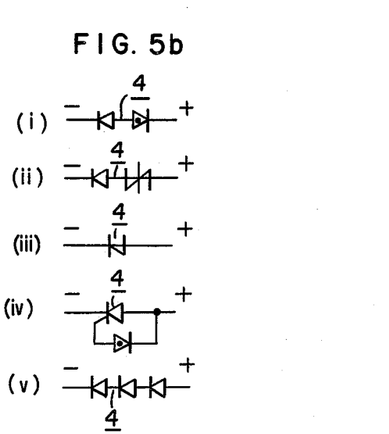

In the beginning of the turn-on operation, the power transistor base is driven through the base current source 61, the resistor 64, the solid-state switch 2, the diode 16, the secondary winding 32 and the power transistor 1. When the main current $I_1$ becomes present as a result of the turn-on, the secondary winding starts supplying voltage and current. When the main current $I_1$ becomes substantially large, the voltage drop across the resistor 64 increases, causing the bypass diode 63 to turn on and the secondary winding 32 to provide the necessary base drive current. When the auxiliary solid-state switch 2 is cut off at the turn-off operation, the base current $I_{b1}$ is cut off and the secondary current $I_{32}$ is shunted to the shunt means 4 till the main current $I_1$ ceases. The shunt means may be a zener diode, breakover switch, PNPN switch, thyristor or diodes as shown in FIGS. 5(b) (i), (ii), (iii), (iv) and (v).

FIG. 5(a) shows another method for controlling the reset switch 17, which uses a core magnetization detecting means 34' capable of detecting the flux density of the core or about the core, the magnetomotive force corresponding to the flux density, the field intensity at the core or the magnetic path, or the magnetomotive force present along the magnetic path. This magnetic detection may be made in the following manner. A magnetic circuit comprising at least part of the magnetic path of the core is provided, or the core is formed of a plurality of cores, or the magnetic path of the core is formed of a plurality of magnetic branches. Then (1) a means for embedding a magnetic sensing element, (2) a magnetic modulation means, (3) a variable inductance detection winding circuit means or an oscillation circuit means may be employed in the circuit of magnetization detecting means 34'. Thus the reset switch 17 is controlled by the magnetization detecting means to make it possible to maintain the operation of the current transformer 3.

In FIGS. 1(a), 3, 4 and 5(a), the load 200 may be positioned serially in the loop of the flux reset means 17, secondary winding 36 and power source 100 as indicated by the dotted rectangle 200'. By this arrangement, a negative voltage is applied by the flux reset means from the terminal voltage of the power transistor 1. One simplified form of these embodiments is shown in FIG. 6 wherein the reset switch 17 serves also as the base driving auxiliary solid-state switch 2.

Figure 6:
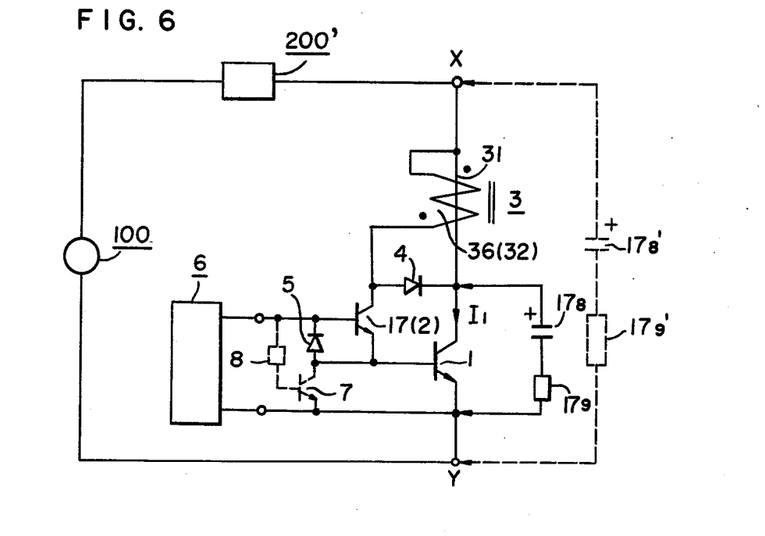

In the arrangement where the load is located at 200' in FIGS. 1 and 3 to 6, flux reset is done once (or twice or so in the embodiment as in FIG. 3) in the beginning of the turn-on operation. In such case, continuous turn-on is not available. However, the maximum on-time ratio as in Eq. (1) can be made as high as approximately 100%. In FIG. 6, there is a period $t_{d1}$ for which the auxiliary solid-state switches 17 and 2 are on and the power transistor 1 is off, the period $t_{d1}$ being ascribed to turn-on delay in the main power transistor 1. During this period, a negative voltage is applied to the secondary winding 32 (36) and the core flux is thereby reset. In practice, surge absorbers $17_8$ and $17_9$ and equivalent surge absorbers $17_8'$ and $17_9'$ present in connection with relevant circuit elements serve as part of the pulse voltage source for resetting the core flux. In other words, these surge absorbers take part in sustaining the voltage across the power path branch X-Y or retarding the fall of the voltage across the same.

Although the period $t_R$ for which the pulse voltage is applied is in the order of several microseconds, the period $t_F$ for which the turn-on current transformer operates may be set to be several hundred microseconds. Hence this switch circuit can be operated efficiently under time ratio control at a repetitive frequency of one to several kilohertz.

In the circuit of FIG. 6, means 7 and 8 may be installed for delaying turn-on of the power transistor 1 in the position indicated by the dotted line to enable flux reset at a desired core to be completed. This makes time ratio modulation possible at a low repetitive frequency.

The shunt means 7 indicated by the dotted line in FIG. 6 shunts the exciting current component contained in the flux which is reset. When flux reset is completed and the core flux reaches its saturation level, the voltage at the shunt means 7 rises and the secondary winding current flows in the main power transistor 1, causing this power transistor to turn on. When the voltage across X-Y falls and the main current $I_1$ increases, the transformer secondary current corresponding to the main current $I_1$ is kept supplied to the base thereof.

In the above operation, it is desirable that the control element 8 of the shunt means 7 should operate in a differential characteristic or turn on for a certain short period of time.

According to the embodiments as in FIGS. 1 and 3 to 5 where the load is positioned as indicated by the dotted line and the embodiment as in FIG. 6, substantially continuous turn-on operation is realized at a uniform turn-on time ratio under the control of time ratio modulation (although the maximum turn-on time $t_{ON}$max is limited in the embodiment as in FIG. 6). In other words, the power transistor switch of the invention can be inserted in the desired power path in the desired power circuit irrespective of where the power source and the load are positioned. This enhances the independence of the switch unit. Accordingly, only two external terminals (excepting the turn-on control terminal) suffices for operating the switch device of the invention.

Figure 7A:
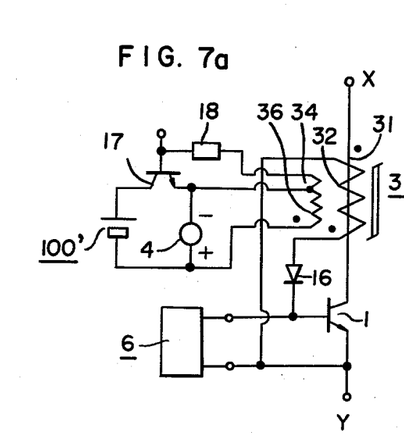
Figure 7B:
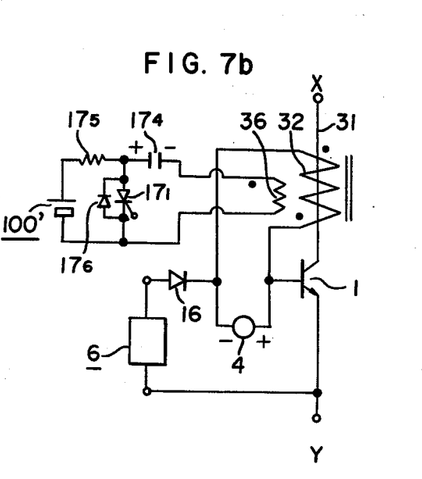

FIGS. 7(a) and 7(b) schematically illustrate another embodiment of the invention wherein the switch circuit is made operable with high independence by the use of two main terminals X and Y, from which the switch can be connected to an arbitrary power circuit network. In this embodiment, fully continuous turn-on operation is also available.

In FIGS. 7(a) and 7(b), the numeral 100' denotes an auxiliary power source. (Instead of this auxiliary power source, the foregoing main power source 100 may be used.) The reset winding 36 is installed independent of the secondary winding 32. FIG. 7(a) shows the arrangement wherein the base drive secondary winding is connected in parallel between the base and the emitter. FIG. 7(b) shows the arrangement wherein the secondary winding is inserted serially in the base drive circuit.

In FIGS. 7(a) and 7(b), during the application of a negative voltage for flux reset, the secondary winding current is shunted to the reset winding, causing the base drive current to be lessened or momentarily interrupted. However, the main power transistor maintains turn-on as long as the period $t_R$ for which the pulse voltage is applied is shorter than the period $t_{S1}$ for which carriers are stored in the power transistor. Thus, by simply triggering the reset switch 17 at a given cycle, flux reset is carried out to maintain the current transformer in operation without affecting the main power circuit.

This concept can apply to various pulse reset systems in which, for example, the reset winding 36 is disposed in series-parallel connection with respect to a plurality of current transformers, or a plurality of power transistors, and a negative pulse voltage (or a negative pulse current) is applied concurrently through one reset switch circuit.

According to the invention, as described above, the core of the current transformer is magnetized by pulse means to realize a method for self-replenishing the base drive power with a large turn-on time ratio. Also, the core is pulse-magnetized in relation to the degree of magnetization, permitting flux reset by the pulse magnetization to be securely carried out.

Figure 8A:
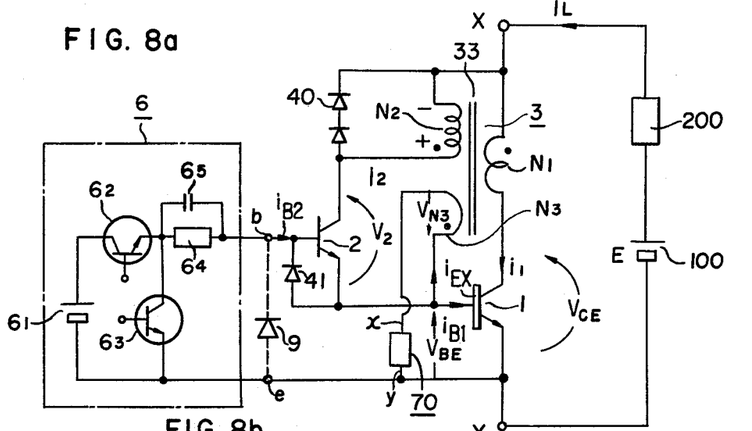
Figure 8B:
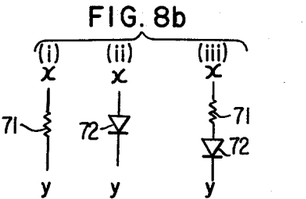

FIGS. 8(a) and 8(b) schematically illustrates another embodiment of the invention, which comprises a power semiconductor switch 1, e.g., power transistor, connected serially in a power path connecting a DC power source 100 and a load 200. An auxiliary solid-state switch 2, e.g., transistor or gate-turn-off thyristor, is connected between the first main electrode (collector) and the control electrode (base) of the semiconductor switch 1. A voltage transformer 3 is provided, having its primary winding $N_1$ inserted serially in the power path and its secondary winding $N_2$ inserted serially in the auxiliary solid-state switch 2. The secondary winding current corresponding to the main current in the power path is supplied to the control electrode of the switch 1, and the secondary winding voltage is applied to the auxiliary solid-state switch 2 and branch circuit to the control electrode. The transformer 3 receives at its primary winding the main electrode current $i_1$ from the semiconductor switch 1 and supplies its secondary current $i_2$ to the control electrode of the semiconductor switch through the auxiliary solid-state switch 2. The secondary winding voltage $V_{N2}$ (with the forward direction indicated by $\oplus$ and $\ominus$ signs) is supplied in order to compensate for the voltage drop across the auxiliary switch 2 and the control electrode (e.g., $V_{BE}$). By this arrangement, a sufficient potential at the control electrode, or a sufficient control current, can be maintained even if the voltage between the main electrodes (e.g., $V_{CE}$) is low. The transformer 3 used in the embodiment is such that the primary winding $N_1$ serves as part of the substantial secondary winding, and the winding $N_2$ together with the primary winding $N_1$ serves as the substantial secondary winding $N_2'$.

According to the embodiment shown in FIG. 8(a), the transformer 3 has a tertiary winding $N_3$, which is connected between the control electrode (e.g., base) and the second main electrode (e.g., emitter, serving also as the control electrode). The tertiary winding $N_3$ assumes a polarity leading to a forward control electrode potential by the primary winding current, or a polarity leading to a reverse control electrode potential by the secondary winding current.

According to the embodiment shown in FIG. 8(a), a current adjusting means 70 may be installed serially with the tertiary winding. The purpose of the means 70 is to make the tertiary-primary winding ratio $N_3/N_1$ smaller than the secondary-primary winding ratio $N_2/N_1$ or to supply part of the control electrode current by operating the tertiary winding substantially parallel with the secondary winding by bringing the number of turns of the tertiary winding near that of the secondary winding ($N_3 < N_2$). To realize the former arrangement, a series circuit having a resistor, a diode or the combination of a resistor and a diode as shown in FIGS. 8(b) (i), (ii) and (iii) may be used. For the latter, a resistor circuit may be used.

In the embodiment of FIG. 8(a), when a forward control voltage (or current) is applied between terminals b and e, the auxiliary solid-state switch 2 becomes conducting. The power semiconductor switch 1 does not turn on immediately upon application of the forward control voltage since this semiconductor switch has an operating delay of several hundred nanoseconds to several microseconds. Even though the switch 1 turns on slightly, the control current $i_{B2}$ is not sufficient to allow the main current $i_L$ to flow in full. Accordingly, the voltage $V_{CE}$ of the semiconductor switch 1 does not fall immediately, permitting the voltage across X-Y to be maintained. In this state, therefore, current flows first in the path: 100—200—X—$N_2$—2—$N_3$—7-0—Y. When the current $i_L$ in the load circuit 200 is larger than the exciting current $i_{EX}$ for the current transformer 3, the voltage across terminals X and Y does not fall appreciably even if the exciting current $i_{EX}$ flows. Even in a load circuit comprising an inductive load with a reversely parallel flywheel diode, the voltage across X-Y does not fall when $i_L > i_{EX}$. Thus the voltage across X-Y is applied to the series winding of $N_2$ and $N_3$. In the above path, the secondary winding $N_2$ is reversely serial to the tertiary winding $N_3$ and hence the composite number of windings is $(N_2-N_3)$. Therefore the exciting current $i_{EX}=AT_{EX}/(N_2-N_3)$, where $AT_{EX}$ is the exciting ampere turns. The voltage $V_{XY}$ across terminals X and Y is applied to the winding whose number of turns is $(N_2-N_3)$. With the voltage $V_{XY}$ applied, the voltages $V_{N2}$ and $V_{N3}$ are induced across the secondary winding $N_2$ and the tertiary winding $N_3$ respectively.

$$V_{N2} = \frac{-N_2}{(N_2 - N_3)} V_{XY} < 0 \qquad (3a)$$

-continued $$V_{N3} = \frac{-N_3}{(N_2 - N_3)} V_{XY} < 0 \tag{3b}$$

where $N_2 > N_3$ (3c)

The voltages $V_{N2}$ and $V_{N3}$ are of negative polarity on the side indicated by the dot in FIG. 8. Accordingly, the control electrode of the power semiconductor switch 1 is reversely biased. The component elements 71 and 72 of the current adjusting means 70 are selected so that the condition $|V_{N3}| > V_{7xy}$ holds. ($V_{7xy}$ is the voltage drop across terminals x and y.) For example, when the equivalent resistance $r_{70}$ of the current adjusting means 70 is given as: $r_{70} = V_{7xy}/i_{EX}'$ then the value of $r_{70}$ is determined to be: $r_{70} = |V_{N3}|/i_{EX}$.

Thus the control electrode of the power semiconductor switch 1 is reversely biased by the voltage $V_{BE} = -(|V_{N3}| - V_{xy})$ to maintain the semiconductor switch 1 nonconducting. In other words, the tertiary winding $N_3$ serves to reversely bias the semiconductor switch 1 (or to keep the semiconductor switch cut off).

In the closed loop: the winding $N_3$—current adjusting means 70—terminal e—turn-on control means 6—terminal b—auxiliary solid-state switch 2—winding $N_3$, the internal voltage of the turn-on control means 6 and the voltage $|V_{N3}| - V_{7xy}$ are superposed on each other, causing the control current $i_{B2}$ to increase and the auxiliary solid-state switch 2 to become more conductive. If it is assumed that the turn-on control means 6 comprises a control power source 61, a turn-on control switch 62 and a control resistor 64, then the voltage of the power source 61 and the voltage $|V_{N3}| - V_{7xy}$ are applied together to the control resistor 64 and the control electrode. With a reverse parallel diode 9 inserted between the control terminals b and e as indicated, the control current $i_{B2}$ to the auxiliary solid-state switch 2 is maintained through $N_2$—70—9—2 even if the control resistor 64 is of high resistance or the turn-on control switch is cut off after a short time. In this operation, the tertiary winding $N_3$ gives positive feedback for the auxiliary solid-state switch 2.

In the above manner, the period $t_R$ is maintained, for which the power semiconductor switch 1 is cut off and the auxiliary solid-state switch 2 is conductive. The operation for this period is illustrated by waveforms $t_1$ and $t_2$ in FIG. 9. The waveforms (a), (b) and (c) are of the control current $i_{B2}$ of the auxiliary solid-state switch 2, the tertiary winding voltage $V_{N3}$ with its positive polarity indicated by the dot (•) in FIG. 8, and the control electrode current $i_{B1}$ of the semiconductor switch 1 respectively. The waveform of the control electrode voltage $V_{BE}$ of the power semiconductor switch 1 is similar to that of the current $i_{B1}$ as in FIG. 9 (c) although they differ in level ratio.

Figure 9:
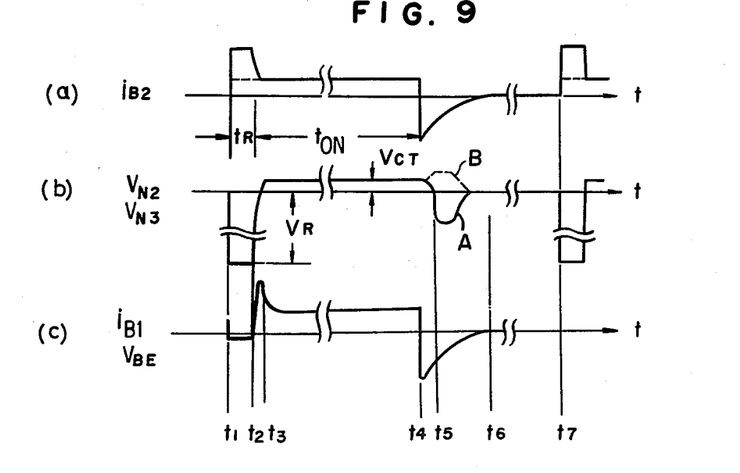
FIG. 9 is a waveform diagram useful for illustrating operations of the circuit shown in FIG. 8, FIGS. 10 and 11 are circuit diagrams showing other embodiments of the invention.

During the period $t_R$, the flux of the core 33 of the current transformer 3 goes to the negative saturation level, causing the core flux to be reset.

When the core flux approaches the negative saturation level, the exciting current $i_{EX}$ increases and the flux voltage falls. Consequently, $|V_{N3}| - V_{7xy} < 0$, that is, $V_{BE} > 0$. In this state, biasing of the control electrode of the semiconductor switch 1 is shifted to the forward direction. This transition occurs at $t_2$ in FIG. 9. The semiconductor switch 1 remains conductive, the voltage $V_{XY}$ across X-Y falls, $|V_{N3}|$ further decreases, and $V_{BE}$ turns forward. As a result, the semiconductor switch becomes fully conducting and the load current $i_L$ flows through the primary winding $N_1$ and the semiconductor switch 1.

The sum of the voltage drop $V_{2(ON)}$ across the auxiliary solid-state switch 2 and the control electrode voltage $V_{BE}$ of the semiconductor switch 1 is higher than the voltage drop $V_{CE(ON)}$ across the power semiconductor switch 1, or $$V_{CE(ON)} \leq V_{2(ON)} + V_{BE} \tag{4}$$

It is desirable that the voltage drop across the semiconductor switch be maintained lower than the sum of $V_{2(ON)}$ and $V_{BE}$. If the condition $V_{CE(ON)} \geq V_{2(ON)} + V_{BE}$ is allowed, the need for the current transformer 3 will be obviated. In such case, however, the voltage drop $V_{CE(ON)}$ is high with the result that power loss increases and the heat dissipating means for the power semiconductor switch becomes intricate.

The condition of Eq. (4) is used in the ordinary operating range of the switch device. In the embodiment shown in FIG. 8, the voltage $V_{2(ON)} + V_{BE} - V_{CE(ON)}$ is applied to the winding $(N_2 + N_1) = N_2'$ at the beginning of turn-on of the semiconductor switch 1. As a result, the flux of the core 33 changes from the negative saturation level toward the positive saturation level and rises in the unsaturation region. This flux rise serves to compensate for the voltage drop $V_{BE} + V_{2(ON)}$ and to replenish the control electrode current $i_{B1}$ with the secondary winding current $i_2$ which corresponds to the primary winding current $i_1$. During this operation, almost no current flows in the current adjusting means 70 due to its resistor 71 and diode 72.

When the number of turns of the tertiary winding is relatively large and the current adjusting means 70 is a resistor 71 only as in FIG. 8(b)(i), the condition $V_{N3} > 0$ (with positive polarity indicated by the dot (•)) holds where part of the control electrode current $i_{B1}$ can be supplied from the tertiary winding. This transformer function is maintained until the semiconductor switch is turned off by the control means 6. This period is shown in FIG. 9 ($t_3 - t_4$). The period $t_2 - t_3$ is the time extending from turn-on of the power semiconductor switch 1 to the fall of the voltage across terminals X and Y.

When the circuit between terminals b and e is reversely biased by the turn-on control means 6, the control electrodes of the semiconductor switch and auxiliary solid-state switch are reversely biased, causing the two switches to be turned off. If this turn-off takes place at the semiconductor switch 1 prior to the auxiliary solid-state switch 2, the state $V_{CE} > (V_2 + V_{BE})$ occurs transiently, causing the transformer voltage $V_{N2}$ and $V_{N3}$ to become negative in polarity as indicated by the solid line during the period $t_5 - t_6$ in FIG. 9 (b). For this period, some flux resetting is done. If the auxiliary solid-state switch 2 turns off prior to the semiconductor switch 1, the voltage $V_2 + V_{BE} - V_{CE}$ rises transiently and the transformer positive voltage rises. In practice, such voltage rise is limited by a voltage limiting means 40 which comprises, for example, a diode, the series connection of a diode and a resistor, a breakover switch element, or the series connection of a nonlinear resistance element such as a varistor and a diode. In this operation, the transformer voltage assumes a waveform indicated by the dotted line B during the period $t_5 - t_6$ in FIG. 12(b).

The purpose of a diode 41 shown in FIG. 8(a) is to cause the power semiconductor switch 1 to be turned off prior to the auxiliary solid-state switch 2 and thereby to reset the flux of the core 33 or to cause the auxiliary solid-state switch 2 to be first turned off and thereby to prevent the reverse bias current of the semiconductor switch 1 from becoming insufficient.

In FIG. 8(a), a capacitor 65 is provided in parallel to the resistor 64 to store charges during the turn-on control operation, and the stored charge is used as a pulse source to reversely bias the control electrode through an off-control switch 63. A series of the foregoing operations is repeated.

In the embodiment as in FIG. 8(a), the flux of the core 33 of the current transformer 3 can be reset near the negative saturation level before the semiconductor switch is turned on. Hence, while the current transformer is in operation for turn-on control, the core can be fully utilized over the flux range of negative to positive saturation levels.

The voltage $V_{RN2}$ applied to the secondary winding $N_2$ for the flux reset period $t_R$ may be expressed as $$V_{RN2} = \frac{N_2}{N_2 - N_3} E = \frac{N_2 + N_1}{N_2 - N_3} E \approx E \tag{5}$$

where E is the voltage $V_{XY}(t_R)$ between X and y for the period $t_R$, and approximate expressions for the above are $N_2 >> N_3$ and $N_2 >> N_1$.

The secondary winding voltage $V_{CT}$ present when the current transformer is in operation is $$V_{CT} = V_{2(ON)} + V_{BE} - V_{CE} = V_{N2(ON)} \tag{6}$$

Because the voltage-time integrated values for the two periods are the same, $$V_{RN2} \cdot t_R = V_{CT} \cdot t_{ON} \tag{7}$$

where $t_{ON}$ is the on time

Therefore $$\frac{t_{ON}}{t_R} \approx \frac{E}{V_{2(ON)} + V_{BE} - V_{CE}} \tag{8}$$

When $E = 100$ to $300$ V and $V_{2(ON)} + V_{BE} - V_{CE} = 1$ to 3 V, then $t_{ON}/t_R$ is 30 to 300. This signifies the fact that the current transformer operation is maintained to enable the conduction of the power semiconductor switch to be sustained over the period 30 to 300 times the flux reset period $t_R$. At the maximum current ratio, the maximum turn-on time ratio $\alpha_{MAX}$ is given as follows, with the turn-off time $t_4 - t_6$ neglected.

$$\alpha_{MAX} = \frac{T_{ON}}{t_R + t_{ON}} \approx 0.97 \text{ to } 0.997$$

This, together with the fact that the core flux can be utilized over the range of negative to positive saturation levels as described, makes it possible to reduce the size of the current transformer 3. When flux resetting is completed (or the core flux approaches the negative saturation level), the flux reset mode is automatically shifted to the conduction mode.

Figure 10:
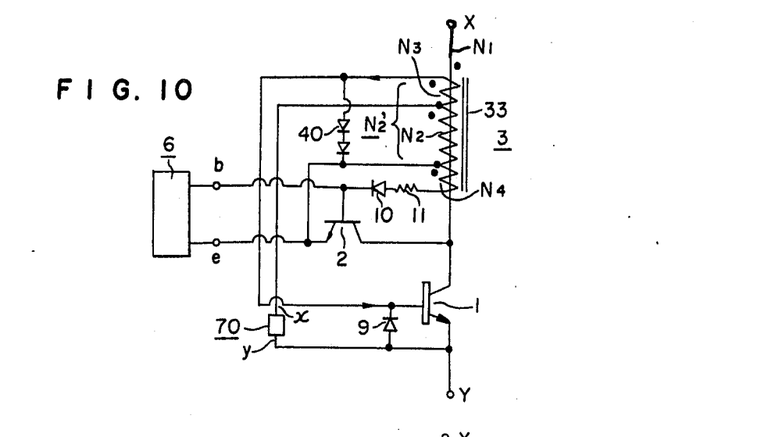
Figure 11:
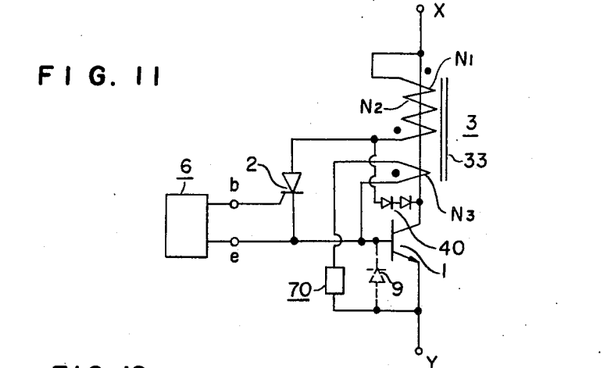

FIGS. 10 and 11 schematically illustrate other embodiments of the invention. In FIG. 10, the secondary winding $N_2$ is inserted between the control electrode of the power semiconductor switch 1 and the auxiliary solid-state switch 2, and the winding $N_2'$ is common to the secondary winding $N_2$ and the tertiary winding $N_3$.

The quaternary winding $N_4$ is connected to the control electrode of the auxiliary solid-state switch 2 through a resistor 11 and a diode 10 and has a positive feedback function on the auxiliary solid-state switch for the flux reset period $t_R$. When the input current from the turn-on control means 6 is large enough, the winding $N_4$, the resistor 11 and the diode 10 are not necessary.

In FIG. 11, a four-layer semiconductor switch such as a gate-turn-off thyristor is used as the auxiliary solid-state switch 2. In the embodiments as in FIGS. 10 and 11, an open two-terminal X-Y network is shown as the fundamental unit of power semiconductor switch device. The current transformer 3 may be inserted in a load or power network in practical applications.

Figures 12A, 12B, 12C, 12D:
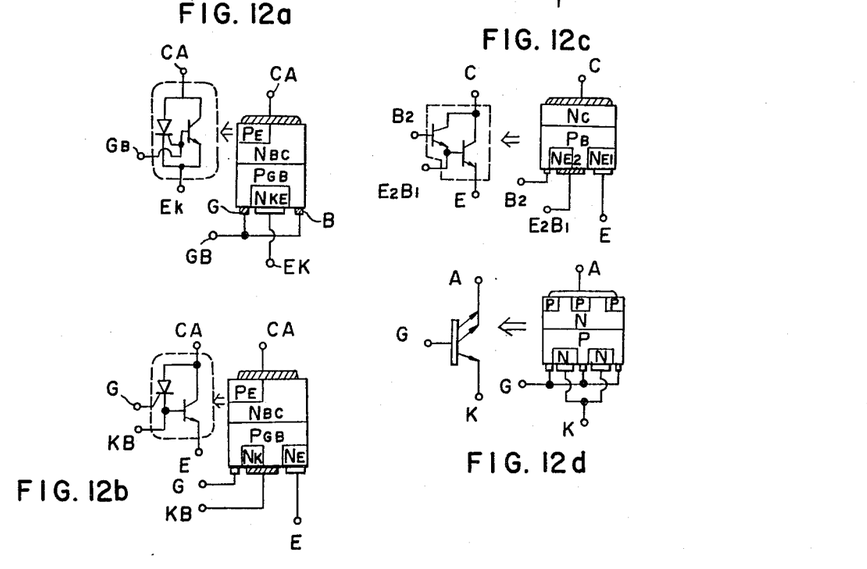
FIGS. 12(a) to 12(d) are conceptual structural diagrams and schematic circuit diagrams showing switch elements formed according to the invention.

FIGS. 12(a) to 12(d) schematically illustrate examples of an auxiliary solid-state switch and a power semiconductor switch used for the purpose of the invention. FIG. 12(a) shows a parallel composite element comprising a transistor and a gate-reverse-biasing thyristor. FIG. 12(b) shows a Darlington composite element comprising a transistor and a gate-reverse-biasing thyristor used as a Darlington auxiliary switch, wherein the base currrent is supplied between KB and E or between G and E. This scheme is useful for a power semiconductor switch operated with the aim to reduce the voltage drop during usual (ordinary) turn-on operation. This circuit can also be used for the auxiliary solid-state switch 2. FIG. 12(c) shows a Darlington transistor composite element comprising an auxiliary transistor and a main transistor. FIG. 12(d) shows an element having characteristics intermediate between those of a transistor and a thyristor having a four-layer part. To maintain this element conductive, a control electrode current is maintained applied as in the transistor operation.

FIGS. 12(b) and 12(c) are examples of power semiconductor switches of the type having two control electrodes. In such construction, the auxiliary solid-state switch 2 may be connected to either electrode. (For this arrangement, another auxiliary solid-state switch 2 is installed in addition to the built-in one.) In the element shown in FIG. 12(b), it is desirable that the transformer secondary current be supplied to the terminal KB of the control electrode of the power transistor. In this element, the gate-reverse-biasing thyristor serves to enhance the ability to withstand overcurrent, and the current transformer serves to reduce the voltage drop and loss during ordinary turn-on operation.

According to the invention, as has been described above, the control electrode current useful for a highly conductive turn-on operation can be realized in the power semiconductor switch device of the invention.

In the foregoing embodiments, flux reset is carried out by utilizing in combination the secondary winding of a transformer and the auxiliary solid-state switch which controls whether to supply secondary current to the control electrode. Alternatively, a means may be used wherein the flux of the transformer core is reset by the terminal voltage of the power semiconductor switch or the voltage corresponding to such terminal voltage for the period the power semiconductor switch 1 is in the nonconductive state.

In the embodiments shown in FIGS. 8(a), 10 and 11, the control electrode of the power semiconductor switch 1 is reversely biased directly by the tertiary winding to cause the semiconductor switch to be nonconductive. Alternatively, in the embodiments in FIGS. 8(a) and 10, an auxiliary bypass switch is used to bypass the control electrode current of the power semiconductor switch 1, and this bypass switch is made conductive by the tertiary winding whereby the power semiconductor switch is made nonconductive indirectly through the reset flux voltage.

In the embodiments shown in FIGS. 8(a) to 11 of the type wherein a voltage transformer is used to supply control electrode current to the power semiconductor switch, the flux of the transformer core is reset by the terminal voltage of the semiconductor switch while the power semiconductor switch remains off whereby flux resetting is simplified. The power semiconductor switch is made nonconductive by the flux voltage during the period of resetting whereby the desired integral value of time for which a voltage is applied for flux reset is maintained.

To simplify the arrangement for supplying the secondary current to the control electrode and resetting the core flux, the auxiliary solid-state switch and the transformer secondary winding may be connected between the control electrode and the main electrode of the power semiconductor switch.

Obviously, numerous modifications and variations of the present invention are possible in light of the above teachings. It is therefore to be understood that within the scope of the appended claims the invention may be practiced otherwise than as specifically described herein.

What is claimed is:

1. A semiconductor switch device comprising:
a semiconductor switch with a control electrode and a plurality of main electrodes disposed serially in a power path connecting a DC power source and a load;
a current transformer having a core and having a primary conductor disposed serially in the power path for passing current in response to a turn-on of the semiconductor switch and a secondary winding connected to the control electrode of the semiconductor switch, current flowing in the primary conductor generating a magnetization;
a magnetizing force applying means for magnetizing the core of the current transformer in a direction opposite to the magnetization generated by the current flowing in the primary conductor;
the magnetizing force applying means comprising a loop circuit consisting of a series connection of the DC power source, a reset switch and the secondary winding of the current transformer, the loop circuit passing through the control electrode and one of the main electrodes of the semiconductor switch; and
a detecting winding magnetically coupled to the core of the current transformer and a coupling circuit for receiving the output of the detecting winding and thereby causing the reset switch to conduct.

2. A semiconductor switch device comprising:
a semiconductor switch with a control electrode disposed serially in a power path connecting a DC power source and a load;
a current transformer having a core and having a primary conductor disposed serially in the power path for passing current in response to a turn-on of the semiconductor switch and a secondary winding connected to the control electrode of the semiconductor switch, current flowing in the primary conductor generating a magnetization;
a magnetizing force applying means for magnetizing the core of the current transformer in a direction opposite to the magnetization generated by current flowing in the primary conductor;
turn-on control means for controlling the semiconductor switch; and
means for shunting the secondary current of the current transformer.

3. A semiconductor switch device comprising:
a semiconductor switch with a control electrode disposed serially in a power path connecting a DC power source and a load;
a current transformer having a core and having a primary conductor disposed serially in the power path for passing current in response to a turn-on of the semiconductor switch and a secondary winding connected to the control electrode of the semiconductor switch, current flowing in the primary conductor generating a magnetization;
a magnetizing force applying means for magnetizing the core of the current transformer in a direction opposite to the magnetization generated by the current flowing in the primary conductor; and
shunt means for delaying the turn-on of the semiconductor switch.

4. A semiconductor switch device comprising:
a semiconductor switch with a control electrode and a plurality of main electrodes serially disposed in a current path and turned on when a control electrode current is supplied to its control electrode;
a current transformer having a core and having a primary winding disposed in the current path and a secondary winding for supplying the control electrode current to the control electrode, current flowing in the primary winding generating a flux in the core;
whereby the flux of the core of the current transformer is reset by a voltage between first and second main electrodes of the semiconductor switch while the semiconductor switch is non-conducting; and
an auxiliary semiconductor switch disposed in series with the secondary winding of the transformer, the resultant series circuit being disposed between the control electrode and the first main electrode of the semiconductor switch;
the current transformer having a tertiary winding disposed between the control electrode and the second main electrode of the semiconductor switch.

5. A semiconductor switch device according to claim 4 wherein current adjusting means is disposed serially with the tertiary winding between the control electrode and the second main electrode of the semiconductor switch.

6. A semiconductor switch device comprising:
a semiconductor switch with a control electrode and a plurality of main electrodes serially disposed in a current path and turned on when a control electrode current is supplied to its control electrode;
a current transformer having a core and having a primary winding disposed in the current path and a secondary winding for supplying the control electrode current to the control electrode, current flowing in the primary winding generating a flux in the core;
whereby the flux of the core of the current transformer is reset by a voltage between first and second main electrodes of the semiconductor switch while the semiconductor switch is non-conducting;

an auxiliary semiconductor switch disposed between the secondary winding and the control electrode of the semiconductor switch; and means for exerting a positive feedback effect on the auxiliary semiconductor switch for the period during which the flux of the core of the current transformer is reset.

7. A semiconductor switch device comprising:

a semiconductor switch with a control electorde and a plurality of main electrodes serially disposed in a current path and turned on when a control electorde current is supplied to its control electrode;

a current transformer having a core and having a primary winding disposed in the current path and a secondary winding for supplying the control electrode current to the control electrode, current flowing in the primary winding generating a flux in the core;

whereby the flux of the core of the current transformer is reset by a voltage responding to a voltage between first and second main electrodes of the semiconductor switch while the semiconductor switch is nonconducting;

an auxiliary semiconductor switch disposed between the secondary winding and the control electrode of the semiconductor switch; and means for exerting a positive feedback effect on the auxiliary semiconductor switch for the period during which the flux of the core of the current transformer is reset.

8. A semiconductor switch device comprising:

a semiconductor switch with a control electrode and with a plurality of main electrodes, the main electrodes being disposed serially in a power path connecting a power source and a load;

a current transformer having a core and having a primary conductor disposed serially in the power path for passing current in response to conduction of the semiconductor switch and having a secondary winding connected to the control electrode for supplying regenerative secondary current to the control electrode;

a pulse applying means for applying pulse voltage to the secondary winding of the current transformer in a polarity reverse to the polarity of the regeneration by current flowing in the primary conductor;

the reverse pulse voltage applied by the pulse applying means being greater than the regenerating voltage generated by the primary conductor.

9. A semiconductor switch device comprising:

a semiconductor switch with a control electrode and with a plurality of main electrodes, the main electrodes being disposed serially in a power path connecting a power source and a load;

a current transformer having a core and having a primary conductor disposed serially in the power path for passing current in response to conduction of the semiconductor switch and having a secondary winding connected to the control electrode for supplying regenerative secondary current to the control electrode;

a pulse applying means for applying pulse voltage to a third winding of the current transformer in a polarity reverse to the polarity of the regeneration by current flowing in the primary conductor;

the reverse pulse voltage applied by the pulse applying means being greater than the regenerating voltage generated by the primary conductor.

* * * * *